(12) United States Patent
Fujiwara

(10) Patent No.: US 7,791,837 B2
(45) Date of Patent: Sep. 7, 2010

(54) THIN FILM DEVICE HAVING THIN FILM COIL WOUND ON MAGNETIC FILM

(75) Inventor: Toshiyasu Fujiwara, Tokyo (JP)

(73) Assignee: TDK Corporation, Tokyo (JP)

( * ) Notice: Subject to any disclaimer, the term of this patent is extended or adjusted under 35 U.S.C. 154(b) by 740 days.

(21) Appl. No.: 11/727,502

(22) Filed: Mar. 27, 2007

(65) Prior Publication Data

US 2007/0230042 A1   Oct. 4, 2007

(30) Foreign Application Priority Data

Mar. 31, 2006   (JP)   ............................. 2006-098574
Mar. 31, 2006   (JP)   ............................. 2006-098575

(51) Int. Cl.
G11B 5/147   (2006.01)
(52) U.S. Cl. ............................ 360/123.41; 360/123.4; 360/123.39
(58) Field of Classification Search ............ 360/123.38, 360/123.39, 123.4, 123.46, 123.49, 123.52, 360/125.33, 123.41
See application file for complete search history.

(56) References Cited

U.S. PATENT DOCUMENTS

| | | | | |
|---|---|---|---|---|
| 4,357,640 | A * | 11/1982 | Heinz et al. | 360/125.33 |
| 6,570,739 | B2 * | 5/2003 | Hsiao et al. | 360/125.43 |
| 6,819,527 | B1 * | 11/2004 | Dill et al. | 360/123.01 |
| 6,987,644 | B2 * | 1/2006 | Sato et al. | 360/123.52 |
| 7,116,516 | B2 * | 10/2006 | Dill et al. | 360/123.4 |
| 7,168,156 | B2 * | 1/2007 | Sasaki et al. | 29/603.07 |
| 7,633,711 | B2 * | 12/2009 | Hsiao et al. | 360/123.38 |
| 2006/0152852 | A1 * | 7/2006 | Kobayashi | 360/126 |

FOREIGN PATENT DOCUMENTS

JP   A 5-29146   2/1993
JP   A 2004-296816   10/2004

* cited by examiner

Primary Examiner—Angel A. Castro
(74) Attorney, Agent, or Firm—Oliff & Berridge, PLC

(57) ABSTRACT

A thin film device is provided, in which inductance can be increased when a thin film coil wound on a magnetic film is provided. In a thin film coil wound on a magnetic film, thickness of lower coil portions is smaller than thickness of upper coil portions. Consequently, a magnetic property (permeability) tends to be hardly deteriorated.

8 Claims, 12 Drawing Sheets

THIN FILM DEVICE HAVING THIN FILM COIL WOUND ON MAGNETIC FILM

BACKGROUND OF THE INVENTION

1. Field of the Invention

The present invention relates to a thin film device having a thin film coil wound on a magnetic film.

2. Background Art

Recently, a thin film device having a thin film coil is widely used in a field of electronic instruments for various applications. As an example of the thin film device, a thin film inductor being an inductive circuit element is given.

As a type of the thin film coil mounted in the thin film device, a spiral type is used in accordance with requirement of size reduction (reduction in device area) and low profile (reduction in device thickness), however, a solenoid type is used in an application in which performance is required to be improved in addition to size reduction and low profile (for example, refer to Japanese Unexamined Patent Publication No. 05-029146). In the thin film device having the thin film coil of the solenoid type, an excitation conductor is arranged around a thin film magnetic material (magnetic core) in a solenoid shape, so that inductance can be increased compared with a case that the thin film coil of the spiral type is provided.

As the thin film coil of the solenoid type, a thin film coil having a coil structure being divided into a plurality of parts is known (for example, refer to Japanese Unexamined Patent Publication No. 2004-296816). The thin film coil includes first and second coil conductors formed on one surface and the other surface of a magnetic insulating substrate respectively, and connection conductors formed in through-holes penetrating through the magnetic insulating substrate, the coil conductors and the connection conductors being connected to each other. Thickness of the first coil conductor and thickness of the second coil conductor are the same to make DC resistance uniform over the whole thin film coil.

SUMMARY OF THE INVENTION

While a usual device having the thin film coil of the solenoid type meets the requirement in the light of size reduction and low profile, it cannot be regarded to meet the requirement for improvement in performance. In particular, when the thin film device is applied to a thin film inductor, inductance must be increased to achieve improvement in performance.

In view of foregoing, it is desirable to provide a thin film device in which inductance can be increased when a thin film coil wound on a magnetic film is provided.

A first thin film device of an embodiment of the invention includes a substrate, a magnetic film disposed on the substrate, and a thin film coil wound on the magnetic film; wherein the thin film coil includes a plurality of first coil portions arranged in a layer closer to the substrate, a plurality of second coil portions arranged in a layer away from the substrate, and a plurality of third coil portions connecting the first and second coil portions so that the first, second and third coil portions are combined together in series to form the tin film coil, and thickness of the first coil portions is smaller than thickness of the second coil portions. In the thin film device, unlike a case that the thickness of the first coil portions is equal to the thickness of the second coil portions while the total sum of the thickness of them is constant, the thickness of the first coil portions is not excessively large, therefore unevenness of a base of the magnetic film is decreased. Thus, since flatness of the magnetic film is improved, a magnetic property (permeability) is hardly deteriorated. The thin film device may further have at least two additional magnetic films disposed so as to sandwich the magnetic film and the thin film coil. Moreover, one end or the other end in the longitudinal direction of the second coil portion may be located so as to overlap with one end or the other end in the longitudinal direction of the first coil portion, and the third coil portion is arranged in a position where the second coil portion overlaps with the first coil portion.

A second thin film device of an embodiment of the invention includes a first magnetic film and a second magnetic film disposed oppositely to each other, and a thin film coil wound on the second magnetic film; wherein the thin film coil includes a plurality of first coil portions arranged between the first and the second magnetic films, a plurality of second coil portions arranged at a side opposite to a side of the first coil portions with the second magnetic film between them, and a plurality of third coil portions connecting the first and second coil portions so that the first, second and third coil portions are combined together in series to form the thin film coil, and thickness of the first coil portions in at least ends in a winding direction of the thin film coil is smaller than thickness of the second coil portions. In the thin film coil wound on the second magnetic film in the thin film device, thickness in at least the ends of the first coil portions sandwiched by the first and second magnetic films is smaller than thickness of the second coil portions not sandwiched by the first and second magnetic films. Therefore, the quantity of a leakage flux is decreased between the first and second magnetic films compared with a case that thickness in at least the ends of the first coil portions is larger than the thickness of the second coil portions. In the thin film device, thickness of the respective first coil portions may be smaller than the thickness of the second coil portions. In this case, the respective first coil portions may be equal in thickness to one another, or the thickness of the respective first coil portions may be large in portions other than the ends compared with thickness in the ends. In the latter case, it is preferable that the thickness of the respective first coil portions is gradually increased from the ends to the center. Moreover, it is preferable that one end or the other end in the longitudinal direction of the second coil portion is located so as to overlap with one end or the other end in the longitudinal direction of the first coil portion, and the third coil portion is arranged in a position where the second coil portion overlaps with the first coil portion. Furthermore, it is preferable that a ratio of the thickness TB of the second coil portions to the thickness TA of the first coil portions, namely TB/TA, is in a range of $1 < TB/TA \leq 2.7$ in at least the ends in the winding direction of the thin film coil.

According to the first thin film device of an embodiment of the invention, since the thin film coil wound on the magnetic film is provided, and the thickness of the first coil portions arranged in the layer closer to the substrate is smaller than the thickness of the second coil portions arranged in the layer away from the substrate, inductance can be increased.

According to the second thin film device of an embodiment of the invention, since the thickness of the first coil portions in at least the ends is smaller than the thickness of the second coil portions in the thin film coil wound on the second magnetic film, inductance can be increased compared with the case that the thickness of the first coil portions in at least the ends is larger than the thickness of the second coil portions. In this case, for example, when the ratio TB/TA of the thickness TB of the second coil portions to the thickness TA of the first coil portions is in a range of $1 < TB/TA \leq 2.7$ in at least the ends, sufficient inductance can be obtained while suppressing increase in DC resistance of the thin film coil.

Other and further objects, features and advantages of the invention will appear more fully from the following description.

DETAILED DESCRIPTION OF THE PREFERRED EMBODIMENTS

Hereinafter, preferred embodiments of the invention will be described in detail with reference to drawings.

First Embodiment

Figure 1:
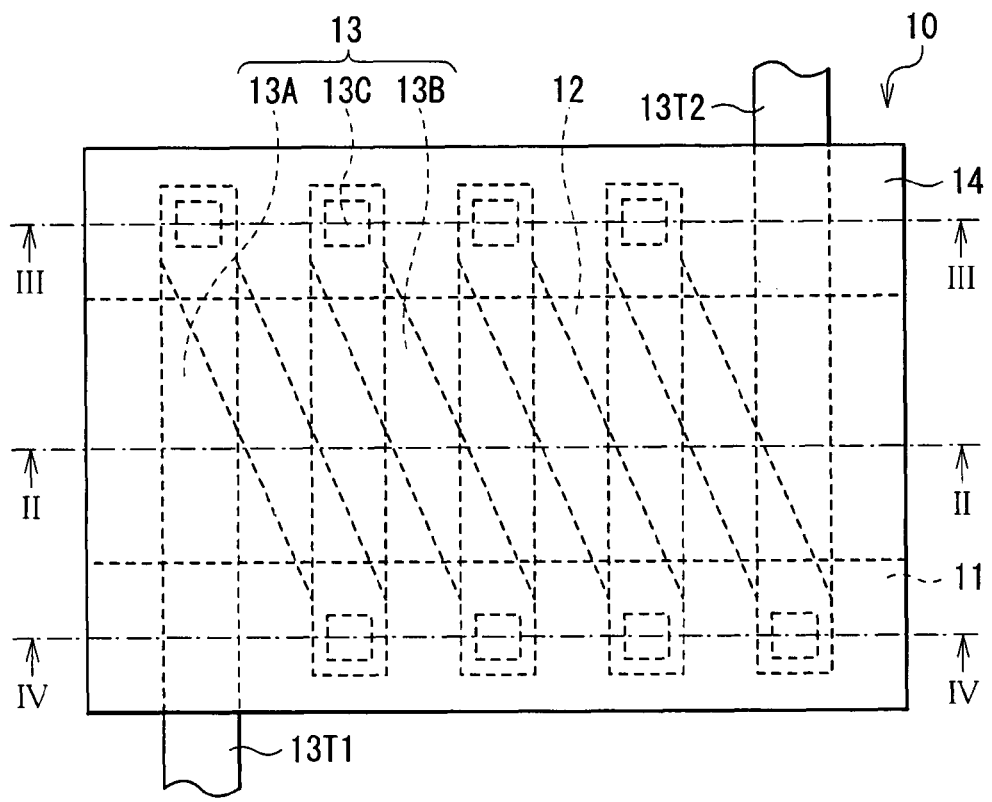
FIG. 1 is a plane view showing a planar configuration of a thin film inductor as an application of a thin film device according to a first embodiment of the invention.
Figure 2:
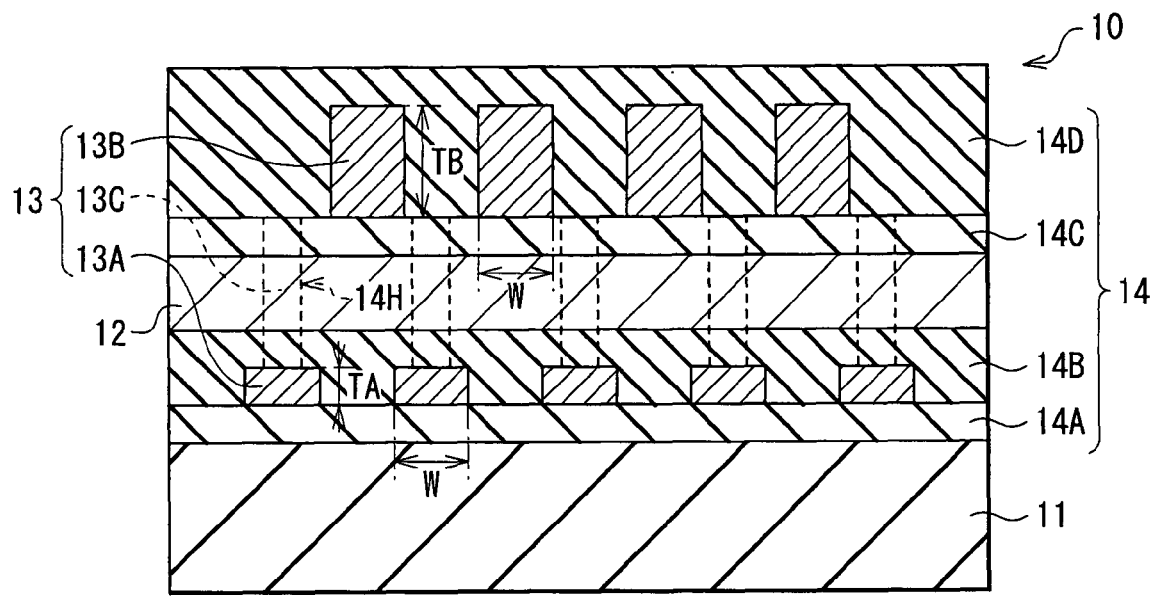
FIG. 2 is a section view showing a sectional configuration of the thin film inductor along a line II-II shown in FIG. 1.
Figure 3:
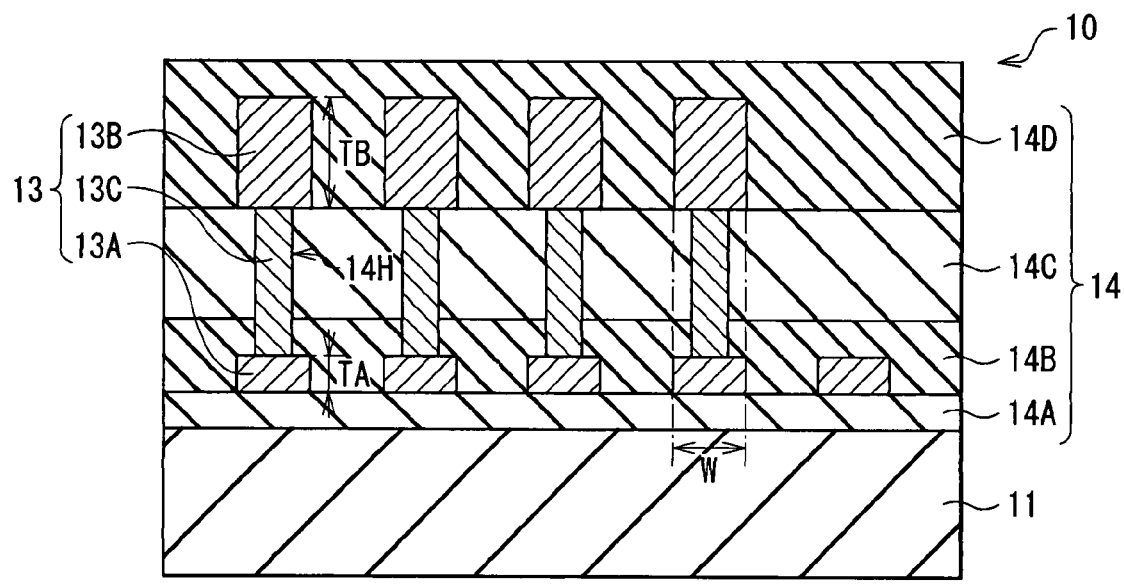
FIG. 3 is a section view showing a sectional configuration of the thin film inductor along a line III-III shown in FIG. 1.
Figure 4:
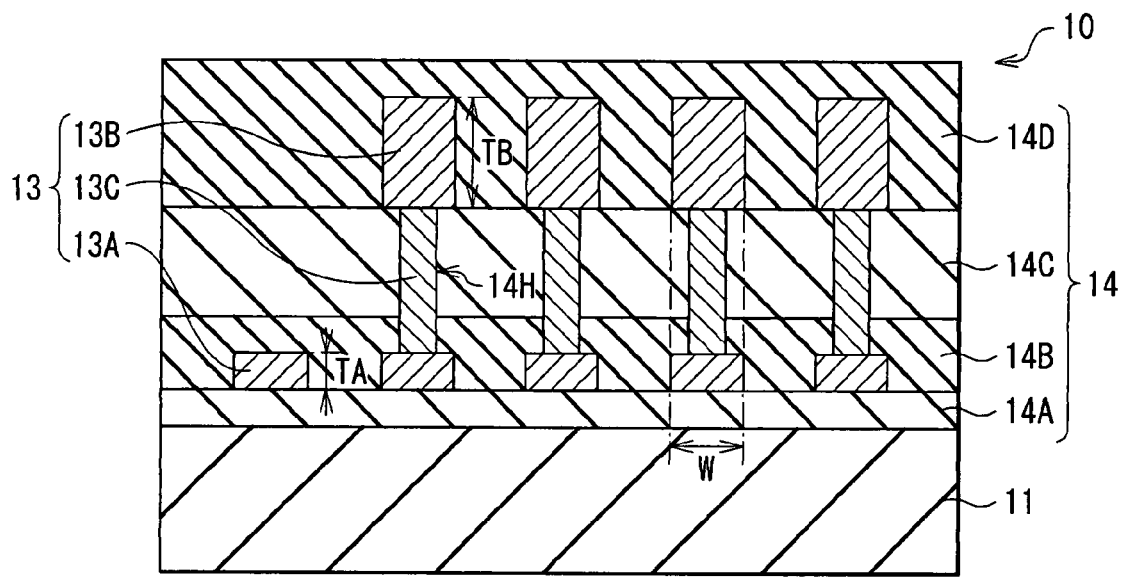
FIG. 4 is a section view showing a sectional configuration of the thin film inductor along a line IV-IV shown in FIG. 1.

FIGS. 1 to 4 show a configuration of a thin film inductor 10 as an application of a thin film device according to a first embodiment of the invention, wherein FIG. 1 shows a planer configuration, and FIGS. 2 to 4 show sectional configurations respectively. Here, FIGS. 2 to 4 show sections along a line II-II, a line III-III, and a line IV-IV shown in FIG. 1, respectively. In the following description, a side closer to a substrate 11 is called "lower side", and a side away from the substrate 11 is called "upper side".

As shown in FIGS. 1 to 4, the thin film inductor 10 includes the substrate 11, a magnetic film 12 disposed on the substrate 11, and a thin film coil 13 of the solenoid type wound on the magnetic film 12. The magnetic film 12 and the thin film coil 13 are buried in an insulating film 14.

The substrate 11 is a substrate for supporting the magnetic film 12 and the thin film coil 13, and includes glass, silicon (Si), aluminum oxide ($Al_2O_3$, so-called alumina), ceramics, ferrite, semiconductor, resin or the like. A componential material of the substrate 11 is not necessarily limited to the series of materials, and may include a different material.

The magnetic film 12 increases inductance, and includes a conductive magnetic material such as cobalt (Co) alloy, iron (Fe) alloy, or nickel-iron alloy (NiFe; so-called Permalloy). As the cobalt alloy, for example, cobalt-zirconium-tantalum (CoZrTa) alloy or cobalt-zirconium-niobium (CoZrNb) alloy is given.

The thin film coil 13 configures an inductor between one end (terminal 13T1) and the other end (terminal 13T2), and includes a conductive material such as copper (Cu). The thin film coil 13 includes a plurality of strip-like lower coil portions 13A (first coil portions) arranged in a layer (lower layer) closer to the substrate 11, a plurality of strip-like upper coil portions 13B (second coil portions) arranged in a layer (upper layer) away from the substrate 11, and a plurality of columnar, intermediate coil portions 13C (third coil portions) disposed in a layer between the lower layer and the upper layer, and connecting the lower coil portions 13A and the upper coil portions 13B so that the lower coil portions 13A, the upper coil portions 13B and the intermediate coil portions 13C are combined together in series to form the thin film coil. Here, for example, one end or the other end in the longitudinal direction of the upper coil portion 13B is located so as to overlap with one end or the other end in the longitudinal direction of the lower coil portion 13A, and the intermediate coil portions 13C is arranged in a position where the upper coil portion 13B overlaps with the lower coil portion 13A. Thickness TA of the lower coil portions 13A is smaller than thickness TB of the upper coil portions 13B. The lower coil portions 13A have, for example, the same width W as that of the upper coil portion 13B.

The insulating film 14 electrically isolates the thin film coil 13 from the magnetic film 12 and the periphery, and includes an insulating nonmagnetic material such as silicon oxide ($SiO_2$) or an insulative resin material such as polyimide or a resist. The insulating film 14 includes, for example, a lower insulating film 14A provided on the substrate 11, a lower coil insulating film 14B provided on the lower insulating film 14A so as to bury the lower coil portion 13A, an upper insulating film 14C provided on the lower coil insulating film 14B so as to bury the magnetic film 12, and an upper coil insulating film 14D provided on the upper insulating film 14C so as to bury the upper coil portion 13B. In the lower coil insulating film 14B and the upper insulating film 14C, a contact hole 14H is provided for each position at which the lower coil portion 13A and the upper coil portion 13B are overlapped with each other, and the intermediate coil portion 13C is buried in each contact hole 14H. Componential materials of a series of insulating films 14A to 14D are not necessarily limited to be the same, and may be individually set.

Next, a method of manufacturing the thin film inductor 10 is described with reference to FIGS. 1 to 4. Hereinafter, since material of the series of componential elements has been described, description of the material is omitted.

That is, first, the lower insulating film 14A is formed on the substrate 11 using a sputtering process or a spin coating process. Then, the plurality of lower coil portions 13A are formed in a patterned manner on the lower insulating film 14A using a plating process or the sputtering process, and then the lower coil insulating film 14B is formed so as to bury the lower coil portions 13A using the sputtering process or the spin coating process. Then, the magnetic film 12 is formed in a patterned manner on the lower coil insulating film 14B using the plating process or the sputtering process, and then the upper insulating film 14C is formed so as to bury the magnetic film 12 using the sputtering process or the spin coating process. Then, the upper insulating film 14C and the lower coil insulating film 14B are selectively etched using a photolithography process, an etching process (for example, ion milling process) and the like, thereby the plurality of contact holes 14H are formed, and then the intermediate coil portions 13C are formed in the respective contact holes 14H so as to be connected to the lower coil portions 13A using the plating process or the like. Finally, a plurality of upper coil portions 13B are formed in a patterned manner on the upper insulating film 14C using the plating process or the sputtering process so as to be connected to the intermediate coil portions 13C, and then the upper coil insulating film 14D is formed so as to bury the upper coil portions 13B using the sputtering process or the spin coating process. Thus, the thin film coil 13 of the solenoid type and the insulating film 14 are formed, and consequently the thin film inductor 10 is completed.

In the thin film inductor 10 as a thin film device according to the embodiment, since the thickness TA of the lower coil portions 13A is smaller than the thickness TB of the upper coil portions 13B in the thin film coil 13 of the solenoid type wound on the magnetic film 12, inductance can be increased according to the following reason.

Figure 5:
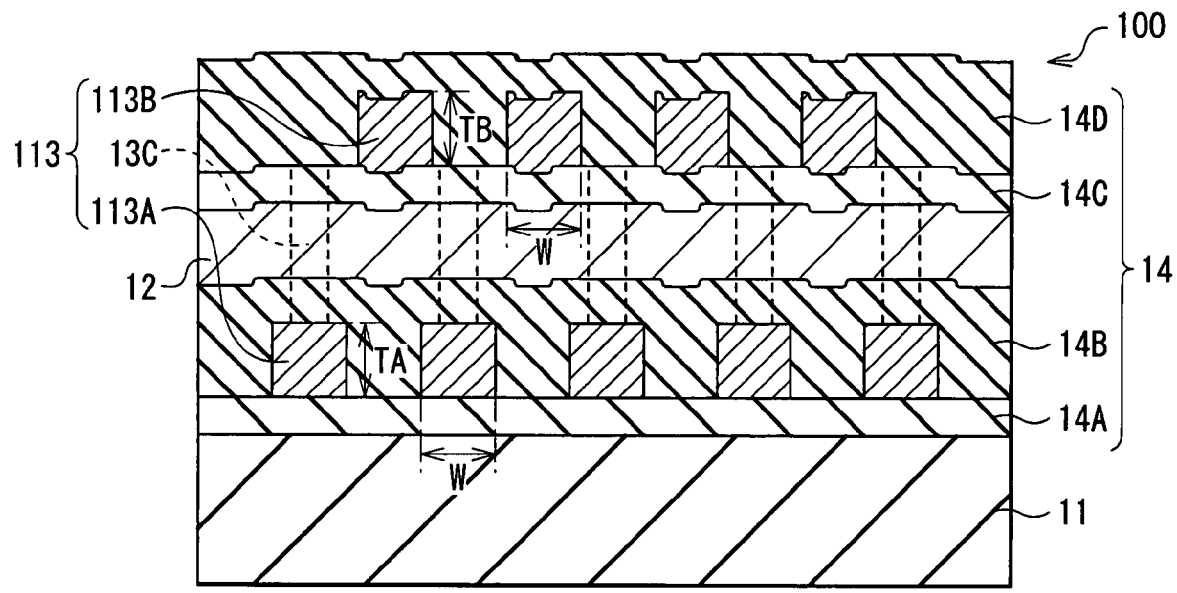
FIG. 5 is a section view showing a sectional configuration of a thin film inductor as a comparative example to the thin film inductor of an embodiment of the invention.

FIG. 5 depicts a configuration of a thin film inductor 100 as a comparative example to the thin film inductor 10, showing a sectional configuration corresponding to FIG. 2. The thin film inductor 100 has the same configuration as that of the thin film inductor 10 except for having a thin film coil 113 (lower coil portions 113A and upper coil portions 113B) in place of the thin film coil 13. The thin film coil 113 has the same configuration as that of the thin film coil 13 except that thickness TA of the lower coil portions 113A is equal to thickness TB of the upper coil portions 113B. The total sum of the thickness TA and the thickness TB is constant between the thin film inductors 10 and 100.

In the thin film inductor 100 of the comparative example, as the thickness TA and the thickness TB are equal to each other, the thickness TA is excessively large, therefore when lower coil portions 113A are formed on the lower insulating film 14A, significant unevenness (difference in height) is produced before forming the lower coil insulating film 14B and the magnetic film 12. In this case, when the lower coil insulating film 14B and the magnetic film 12 are formed significant unevenness is produced in the magnetic film 12 reflecting unevenness of a base, consequently flatness of the magnetic film 12 is reduced, and therefore a magnetic property tends to be deteriorated. More specifically, since a magnetic domain structure in the magnetic film 12 is significantly disturbed due to the unevenness, permeability responsible for inductance is reduced. Thus, in the comparative example, inductance is hardly improved in the case that the thin film coil 113 of the solenoid type is provided.

On the contrary, in the thin film inductor 10 of the embodiment, as the thickness TA is smaller than the thickness TB, the thickness TA is not excessively large, therefore when the lower coil portions 13A are formed on the lower insulating film 14A, produced unevenness is smaller compared with the case of the comparative example. In this case, unevenness produced in the magnetic film 12 is also smaller, consequently flatness of the magnetic film 12 is improved, and therefore a magnetic property (permeability) is hardly deteriorated. Consequently, in the embodiment, inductance can be increased in the case that the thin film coil 13 of the solenoid type is provided.

To describe for confirmation, in FIGS. 2 to 4, the lower coil insulating film 14B and the magnetic film 12 are depicted flat to simplify contents to be shown.

Particularly, in the embodiment, as flatness of the magnetic film 12 is improved, flatness of the upper insulating film 14C formed on the magnetic 12 is also improved. Therefore the upper coil portions 13B can be accurately formed. This is because when the upper insulating film 14C has good flatness in the case that the upper coil portions 13B are formed using the plating process, exposure accuracy in a photolithography step is improved compared with a case that the film 14C has bad flatness.

Moreover, in the embodiment, the thickness TB is increased by a level corresponding to a level of decreasing the thickness TA in the case that the total sum of the thickness TA and the thickness TB is constant, thereby DC resistance of the thin film coil 13 as a whole can be prevented from being increased.

Figure 6:
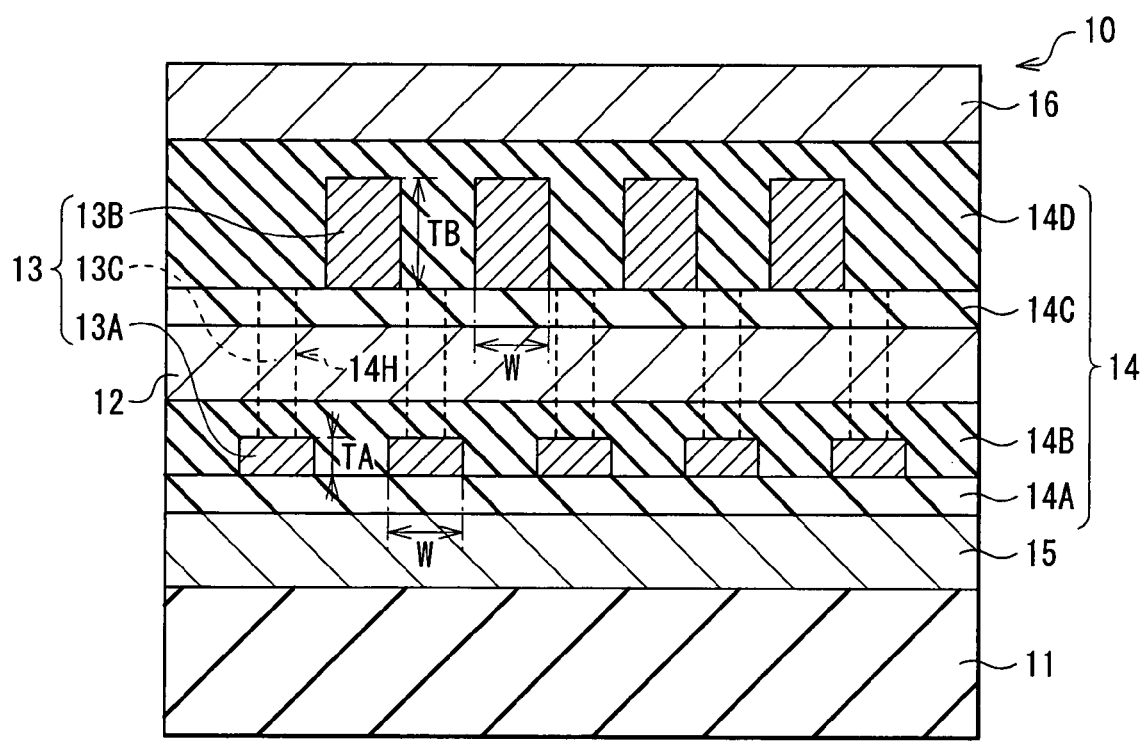
FIG. 6 is a section view showing a modification on a configuration of the thin film inductor.

While only the magnetic film 12 wound with the thin film coil 13 is provided to increase inductance in the embodiment as shown in FIG. 2, this is not necessarily restrictive. For example, as shown in FIG. 6 corresponding to FIG. 2, an additional lower magnetic film 15 and an additional upper magnetic film 16 may be disposed so as to sandwich the magnetic film 12 and the thin film coil 13. Here, the additional lower magnetic film 15 is disposed between the substrate 11 and the lower insulating film 14A, and the additional upper magnetic film 16 is disposed on the upper coil insulating film 14D. Componential materials of the additional lower magnetic film 15 and the additional upper magnetic film 16 may be equal to or different from the material of the magnetic film 12. Moreover, the additional lower magnetic film 15 and the additional upper magnetic film 16 may be provided singly (single-layer structure), or multiply (multilayer structure). In this case, inductance can be increased compared with the case that only the magnetic film 12 is provided. In addition, since flatness of the additional upper magnetic film 16 is improved similarly as the magnetic film 12, contribution to improvement in inductance can be made in the light of a magnetic property of the additional upper magnetic film 16.

While the configuration of the thin film coil 13 is shown in FIGS. 1 to 4 in the embodiment, the number of turns of the coil, a relative positional relationship (overlapped areas) between the lower coil portions 13A and the upper coil portions 13B, a leading direction of the terminal 13T1 or terminal 13T2 or the like is not necessarily limited to that in the case as shown in FIGS. 1 to 4, and may be optionally set.

Figure 7:
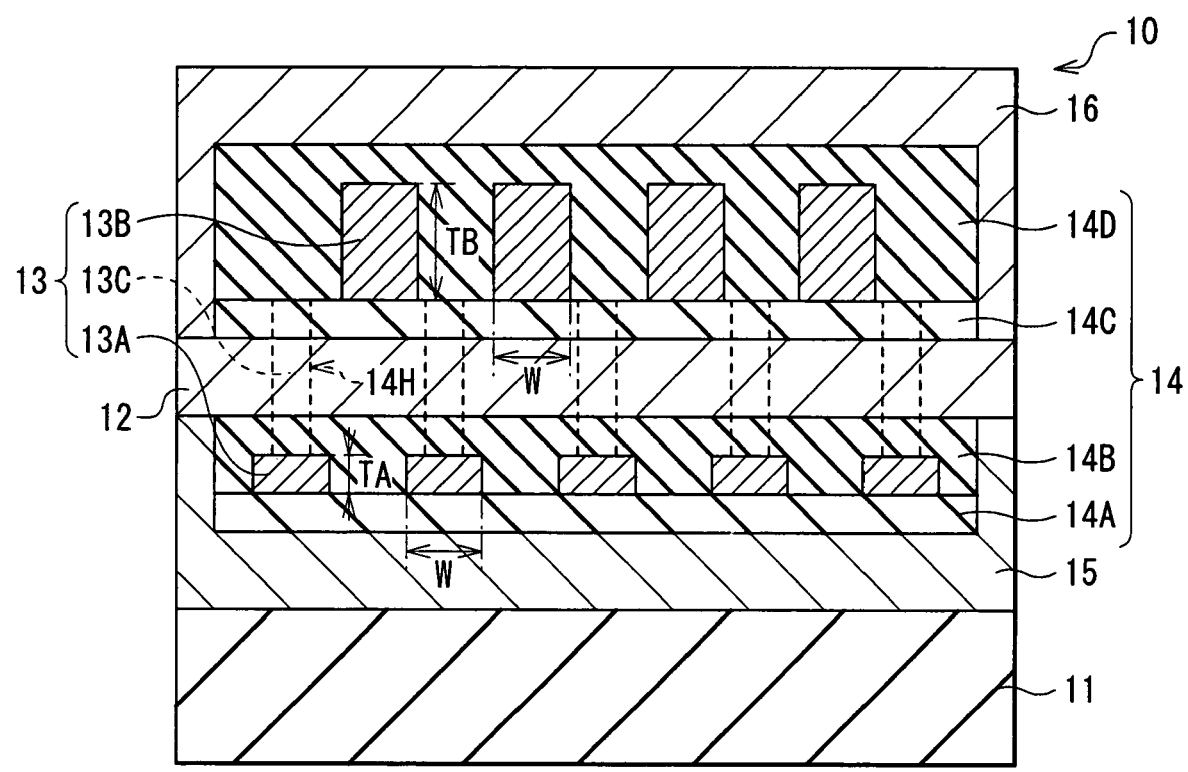
FIG. 7 is a section view showing another modification on a configuration of the thin film inductor.

Particularly, when the additional lower magnetic film 15 and the additional upper magnetic film 16 are provided, one end and the other end of each of the films may be extended to be connected to the magnetic film 12 as shown in FIG. 7 corresponding to FIG. 6. In this case, since a magnetic circuit structure becomes a structure of a closed magnetic circuit, inductance can be further improved. While both of the additional lower magnetic film 15 and the additional upper magnetic film 16 are connected to the magnetic film 12 in FIG. 7, only one of them may be connected to the magnetic film 12.

Second Embodiment

Figure 8:
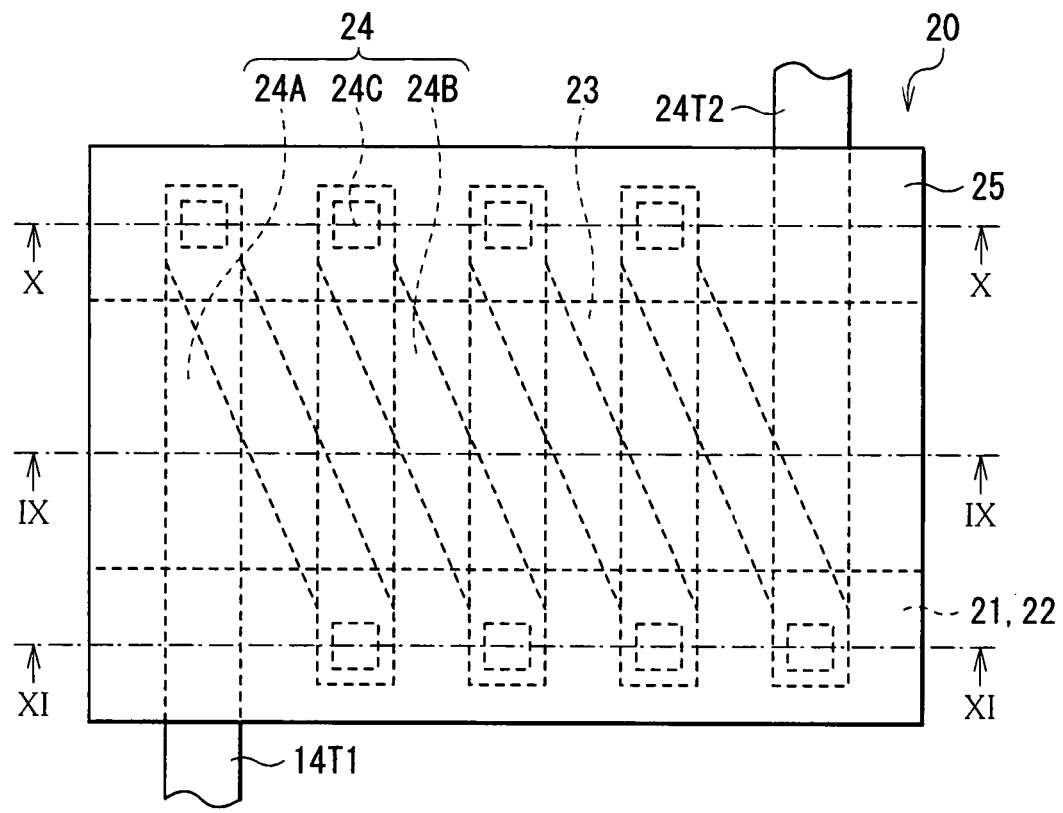
FIG. 8 is a plane view showing a planar configuration of a thin film inductor as an application of a thin film device according to a second embodiment of the invention.
Figure 9:
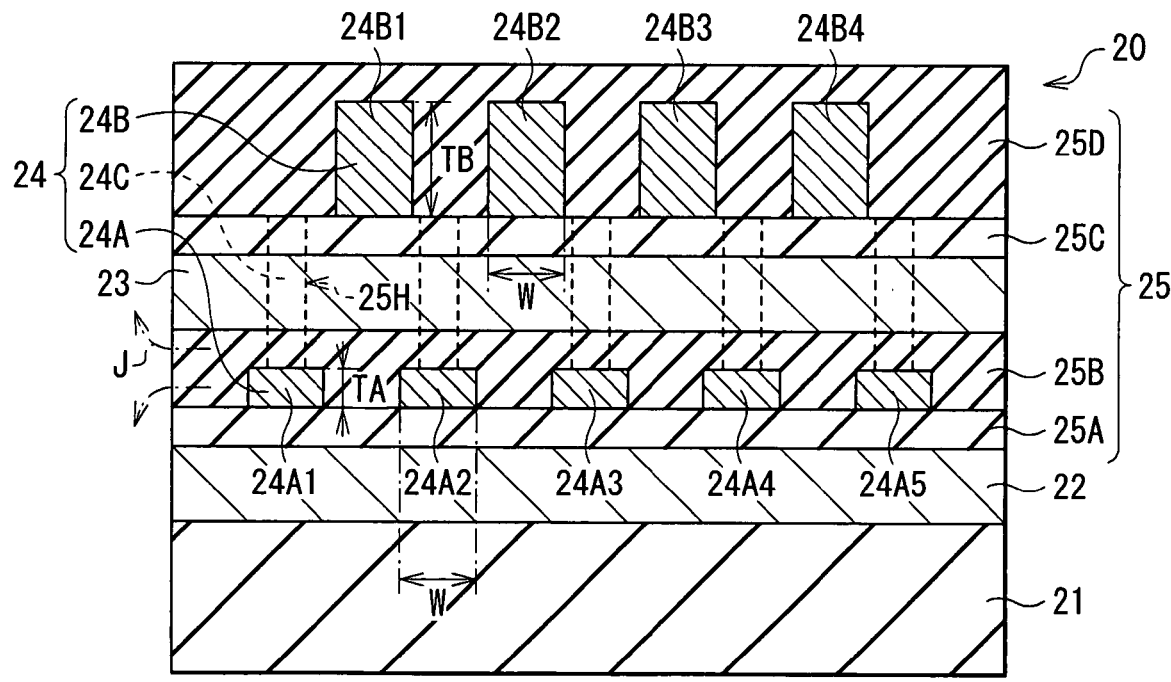
FIG. 9 is a section view showing a sectional configuration of the thin film inductor along a line IX-IX shown in FIG. 8.
Figure 10:
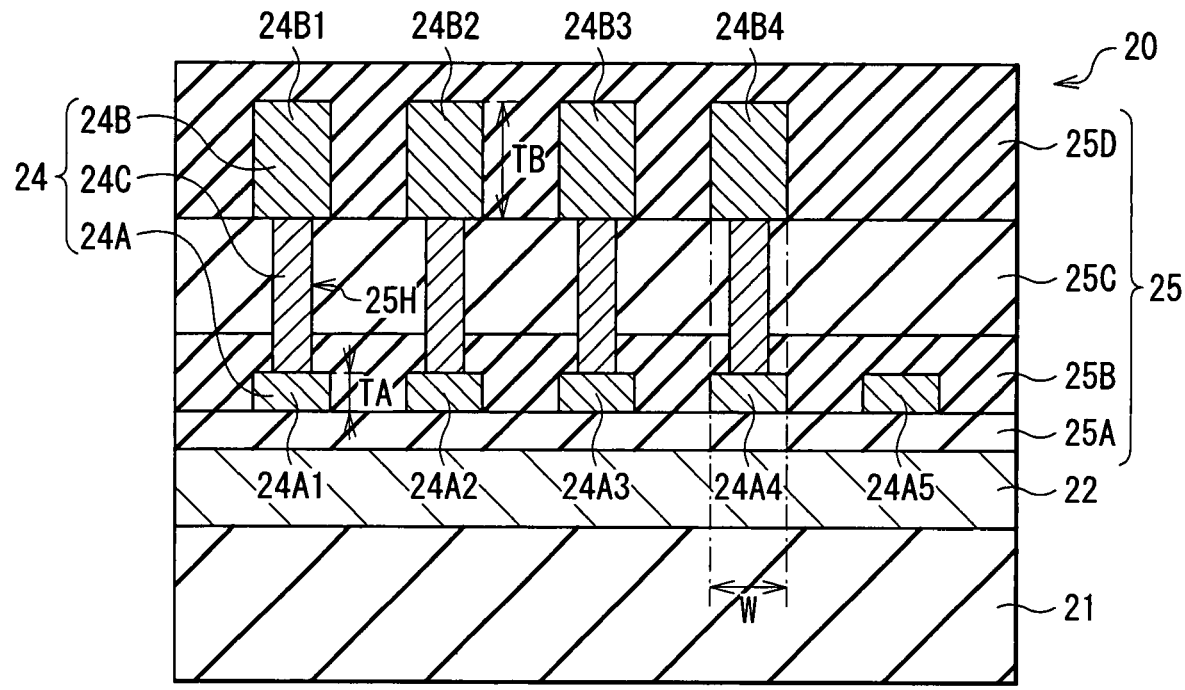
FIG. 10 is a section view showing a sectional configuration of the thin film inductor along a line X-X shown in FIG. 8.
Figure 11:
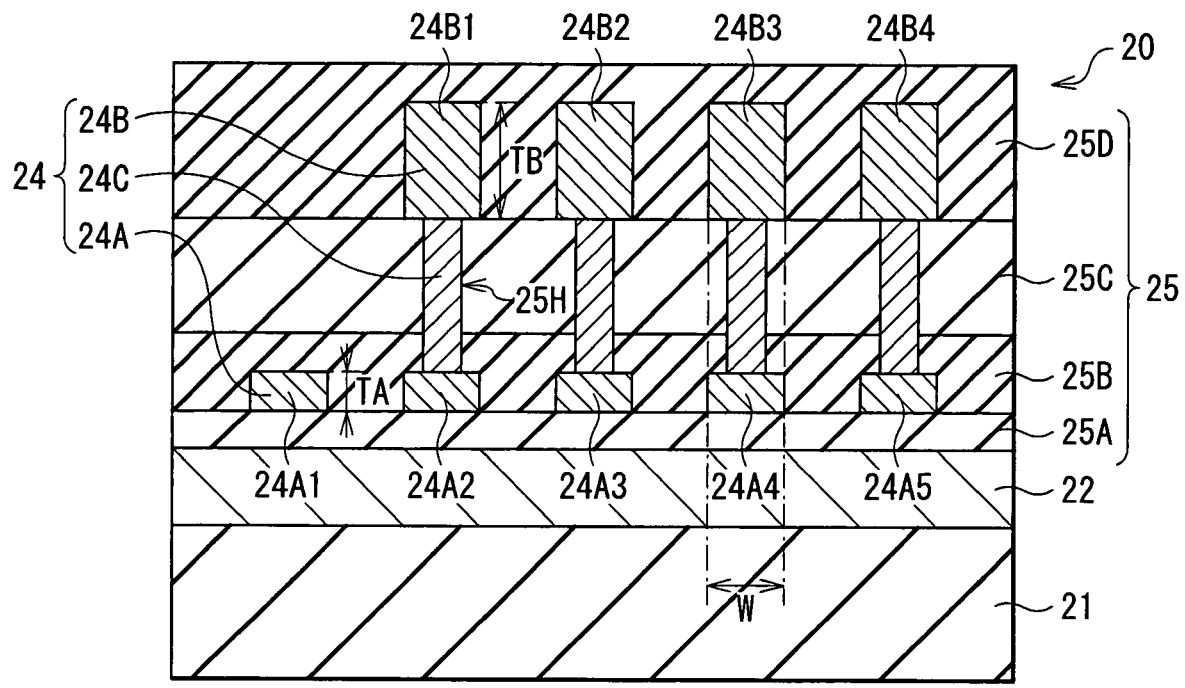
FIG. 11 is a section view showing a sectional configuration of the thin film inductor along a line XI-XI shown in FIG. 8.

FIGS. 8 to 11 show a configuration of a thin film inductor 20 as an application of a thin film device according to a second embodiment of the invention, wherein FIG. 8 shows a planer configuration, and FIGS. 9 to 11 show sectional configurations respectively. Here, FIGS. 9 to 11 show sections along a line IX-IX, a line XX-XX, and a line XI-XI shown in FIG. 8 respectively. In the following description, a side closer to a substrate 21 is called "lower side", and a side away from the substrate 21 is called "upper side".

The thin film inductor 20 has a configuration where a lower magnetic film 22, an upper magnetic film 23 buried in an insulating film 25, and a thin film coil 24 are stacked on a substrate 21. The lower magnetic film 22 and the upper magnetic film 23 are disposed with being opposed to each other, and the thin film coil 24 has a solenoid structure wound on the upper magnetic film 23.

The substrate 21 supports the lower magnetic film 22, upper magnetic film 23, and thin film coil 24, and includes glass, silicon, alumina, ceramics, ferrite, semiconductor, resin or the like. A componential material of the substrate 21 is not limited to the series of materials, and may include a different material.

The lower magnetic film 22 and the upper magnetic film 23 are first and second magnetic films increases inductance respectively, and include a conductive magnetic material such as cobalt alloy, iron alloy, or nickel-iron alloy. As the cobalt alloy, for example, cobalt-zirconium-tantalum alloy or cobalt-zirconium-niobium alloy is given.

The thin film coil 24 configures an inductor between one end (terminal 24T1) and the other end (terminal 24T2), and includes a conductive material such as copper.

The thin film coil 24 is formed by connecting a plurality of strip-like lower coil portions 24A, a plurality of strip-like upper coil portions 24B, and a plurality of columnar, intermediate coil portions 24C so that the three of the coil portions are combined in series. The lower coil portions 24A are first coil portions arranged in a layer (lower layer) between the lower magnetic film 22 and the upper magnetic film 23. The upper coil portions 24B are second coil portions arranged in a layer (upper layer) at a side opposite to a side of the lower coil portions 24A with the upper magnetic film 23 between them, and located so as to overlap with one end or the other end of the lower coil portion 24A. The lower coil portions 24A and the upper coil portions 24B have, for example, a rectangular section profile respectively, and have the same width W. The intermediate coil portions 24C are third coil portions disposed in a layer between the lower layer and the upper layer, and situated at places where the lower coil portions 24A and the upper coil portions 24B are overlapped with each other.

The number of turns of the thin film coil 24 can be optionally set. For example, FIGS. 8 to 11 show a case that the number of turns of the thin film coil 24 is 4. In this case, for example, the lower coil portions 24A are used for terminals 24T1 and 24T2, thereby five lower coil portions 24A (24A1 to 24A5) are arranged, and four upper coil portions 24B (24B1 to 24B4) are arranged.

Thickness TA of a lower coil portion 24A in at least an end in a winding direction of the thin film coil 24 is smaller than thickness TB of the upper coil portions 24B. The "end" means, for example, a lower coil portion 24A situated in an end of an arrangement in which the plurality of lower coil portions 24A are arranged in the winding direction of the thin film coil 24, and refers to not only a case of an end at one end side, but also a case of both ends at one end side and the other end side. The "winding direction of the thin film coil 24" is, for example, a direction in which the thin film coil 24 is advanced with being wound on the upper magnetic film 23 (extended all over), and corresponds to a right and left direction in FIGS. 8 to 11. Here, for example, thickness TA of all the lower coil portions 24A1 to 24A5 is smaller than the thickness TB of the upper coil portions 24B, and the coil portions 24A1 to 24A5 are equal in thickness TA to one another. That is, a ratio of the thickness TB to the thickness TA (thickness ratio) TB/TA is in a range of TB/TA>1. The thickness ratio TB/TA can be optionally set. In particular, it is preferable that the thickness ratio TB/TA is, for example, in a range of 1<TB/TA≦2.7 in the light of suppressing increase in DC resistance of the thin film coil 24.

The insulating film 25 electrically isolates the thin film coil 24 from the lower magnetic film 22 and the upper magnetic film 23, and for example, includes an insulative nonmagnetic material such as silicon oxide or an insulative resin material such as polyimide or a resist. The insulating film 25 includes, for example, a lower insulating film 25A provided on the lower magnetic film 22, a lower coil insulating film 25B provided on the lower insulating film 25A so as to bury the lower coil portions 24A, an upper insulating film 25C provided on the lower coil insulating film 25B so as to bury the upper magnetic film 23, and an upper coil insulating film 25D provided on the upper insulating film 25C so as to bury the upper coil portions 24B. In the lower coil insulating film 25B and the upper insulating film 25C, a contact hole 24H is provided for each position at which the lower coil portion 24A and the upper coil portion 24B are overlapped with each other, and the intermediate coil portion 24C is buried in each contact hole 24H. Componential materials of a series of insulating films 25A to 25D are not necessarily limited to be the same, and may be individually set.

Next, a method of manufacturing the thin film inductor 20 is described with reference to FIGS. 8 to 11. Hereinafter, since material of the series of componential elements has been described, description of the material is omitted.

That is, first, the lower magnetic film 22 is formed on the substrate 21 using the plating process or the sputtering process, then the lower insulating film 25A is formed on the lower magnetic film 22 using the sputtering process or the spin coating process. Then, a plurality of lower coil portions 24A are formed on the lower insulating film 25A in a patterned manner using the plating process or the sputtering process, and then the lower coil insulating film 25B is formed so as to bury the lower coil portions 24A using the sputtering process or the spin coating process. Then, the upper magnetic film 23 is formed in a patterned manner on the lower coil insulating film 25B using the plating process or the sputtering process, and then the upper insulating film 25C is formed so as to bury the upper magnetic film 23 using the sputtering process or the spin coating process. Then, the upper insulating film 25C and the lower coil insulating film 25B are selectively etched using the photolithography process, etching process (for example, ion milling process) and the like, thereby the plurality of contact holes 25H are formed, and then the intermediate coil portions 24C are formed in the respective contact holes 25H so as to be connected to the lower coil portions 24A using the plating process or the like. Finally, a plurality of upper coil portions 24B are formed in a patterned manner on the upper insulating film 25C using the plating process or the sputtering process so as to be connected to the intermediate coil portions 24C, and then the upper coil insulating film 25D is formed so as to bury the upper coil portions 24B using the sputtering process or the spin coating process. Thus, the thin film coil 24 of the solenoid type and the insulating film 25 are formed, and consequently the thin film inductor 20 is completed.

In the thin film inductor 20 as a thin film device according to the embodiment, in the thin film coil 24 of the solenoid type wound on the upper magnetic film 23, the thickness TA of the lower coil portions 24A (24A1 to 24A5) sandwiched by the lower magnetic film 22 and the upper magnetic film 23 is smaller than the thickness TB of the upper coil portions 24B (24B1 to 24B4) not sandwiched by the lower magnetic film 22 and the upper magnetic film 23 (thickness ratio TB/TA>1), therefore inductance can be improved according to the following reason.

Figure 12:
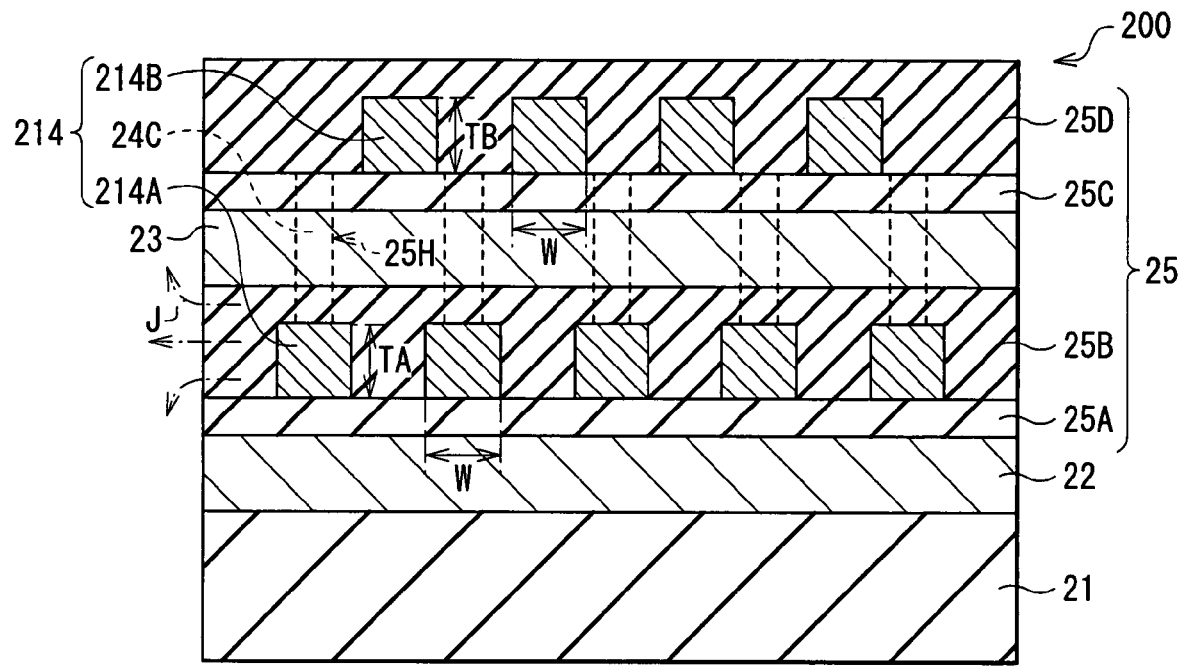
FIG. 12 is a section view showing a sectional configuration of a thin film inductor of a first comparative example.
Figure 13:
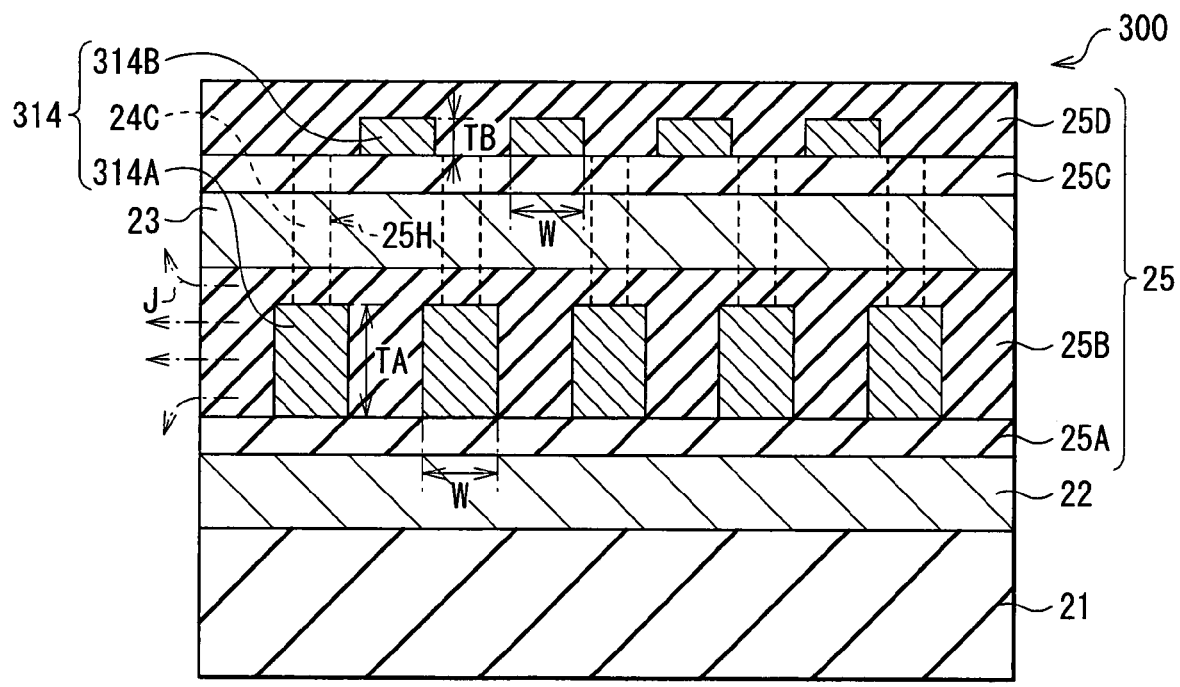
FIG. 13 is a section view showing a sectional configuration of a thin film inductor of a second comparative example.

FIG. 12 and FIG. 13 depict configurations of thin film inductors 200 and 300 as first and second comparative examples respectively, each showing a sectional configuration corresponding to FIG. 9. The thin film inductors 200 and 300 have the same configuration as that of the thin film inductor 20 except that they have a thin film coil 214 (lower coil portions 214A and upper coil portions 214B) and a thin film coil 314 (lower coil portions 314A and upper coil portions 314B) in place of the thin film coil 24 respectively. The thin film coil 214 has the same configuration as that of the thin film coil 24 except that thickness TA of the lower coil portions 214A is the same as thickness TB of the upper coil portions 214B (thickness ratio TB/TA=1). On the other hand, the thin film coil 314 has the same configuration as that of the thin film coil 24 except that thickness TA of the lower coil portions 314A is larger than thickness TB of the upper coil portions 314B (thickness ratio TB/TA<1) The total sum of the thickness TA and the thickness TB is constant in the thin film inductors 20, 200 and 300.

In the thin film inductor 200 of the first comparative example, since the thickness TA of the lower coil portion 214A is excessively large, the lower magnetic film 22 and the upper magnetic film 23 sandwiching the lower coil portions 214A are excessively separated from each other. In this case, since the quantity of a leakage flux J is increased between the lower magnetic film 22 and the upper magnetic film 23, inductance of the thin film coil 214 is decreased. Thus, inductance is hardly increased in the first comparative example.

Moreover, in the thin film inductor 300 of the second comparative example, since the thickness TA of the lower coil portions 314A is larger compared with a case of the first comparative example, the quantity of the leakage flux J is more increased between the lower magnetic film 22 and the upper magnetic film 23. Thus, inductance is still hard to be increased in the second comparative example.

On the contrary, in the thin film inductor 20 of the embodiment, since the thickness TA of the lower coil portion 24A is smaller compared with the case of the first and second comparative examples, the lower magnetic film 22 and the upper magnetic film 23 are sufficiently close to each other. In this case, since the quantity of the leakage flux J between the lower magnetic film 22 and the upper magnetic film 23 is decreased compared with the case of the first and second comparative examples, inductance of the thin film coil 24 is increased. Therefore, in the embodiment, inductance can be increased in the case that the thin film coil 24 of the solenoid type is provided. In this case, as the thickness TA is relatively decreased compared with the thickness TB, that is, as the thickness ratio TB/TA is increased, inductance can be increased.

In particular, in the embodiment, when the thickness ratio TB/TA is in a range of 1.0<TB/TA≦2.7, sufficient inductance can be obtained while suppressing excessive increase in DC resistance of the thin film coil 24.

Moreover, in the embodiment, as the thickness TA of the lower coil portion 24A is smaller than the thickness TB of the upper coil portion 24B, inductance can be further increased in the following light.

That is, in the first and second comparative examples, since the thickness TA of the lower coil portions 214A and 314A are excessively large, when the lower coil portions 214A and 314A are formed on the flat lower insulating film 25A, significant unevenness (difference in height) is produced before forming the lower coil insulating film 25B and the upper magnetic film 23. In this case, when the lower coil insulating film 25B and the upper magnetic film 23 are formed, significant unevenness is produced in the upper magnetic film 23 reflecting unevenness of a base, consequently flatness of the upper magnetic film 23 is reduced, and therefore a magnetic property tends to be deteriorated. More specifically, since a magnetic domain structure in the upper magnetic film 23 is significantly disturbed due to the unevenness, permeability being responsible for inductance is reduced.

On the contrary, in the embodiment, since the thickness TA of the lower coil portions 24A is smaller compared with the cases of the first and second comparative examples, when the lower coil portions 24A are formed on the lower insulating film 25A, excessively large unevenness is not produced. In this case, unevenness produced in the upper magnetic film 23 is also smaller, consequently flatness of the upper magnetic film 23 is improved, and therefore a magnetic property (permeability) is hardly deteriorated. Consequently, in the embodiment, inductance can be increased in the light of the magnetic property depending on flatness of the upper magnetic film 23.

Figure 14:
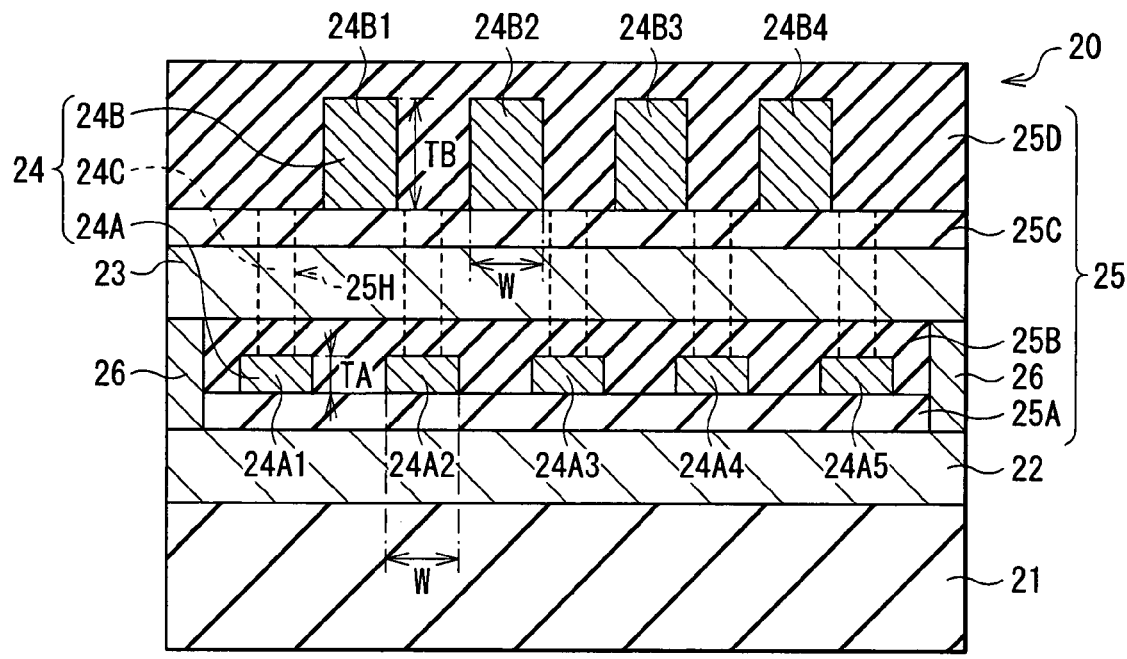
FIG. 14 is a section view showing a modification on a configuration of the thin film inductor of an embodiment of the invention.

While the lower magnetic film 22 is separated from the upper magnetic film 23 in the embodiment as shown in FIG. 9, this is not necessarily restrictive. For example, the lower magnetic film 22 and the upper magnetic film 23 may be connected to each other as shown in FIG. 14 corresponding to FIG. 9. FIG. 14 shows, for example, a case that connection portions 26 are provided between the lower magnetic film 22 and the upper magnetic film 23, thereby one end and the other end of the film 22 is connected to one end and the other end of the film 23 via the connection portion 26, respectively. A magnetic material configuring the connection portions 26 may be equal to or different from a componential material of the lower magnetic film 22 and the upper magnetic film 23. In this case, since a magnetic circuit structure becomes a structure of a closed magnetic circuit, inductance can be more increased.

Moreover, while the respective lower coil portions 24A1 to 24A5 have the same thickness TA in the embodiment as shown in FIG. 9, this is not necessarily restrictive. The thickness TA of the respective lower coil portions 24A1 to 24A5 can be optionally set as long as thickness TA of the lower coil portions 24A (24A1 and 24A5) in at least ends in a winding direction of the thin film coil 23 is smaller than the thickness TB of the upper coil portions 24B.

Figure 15:
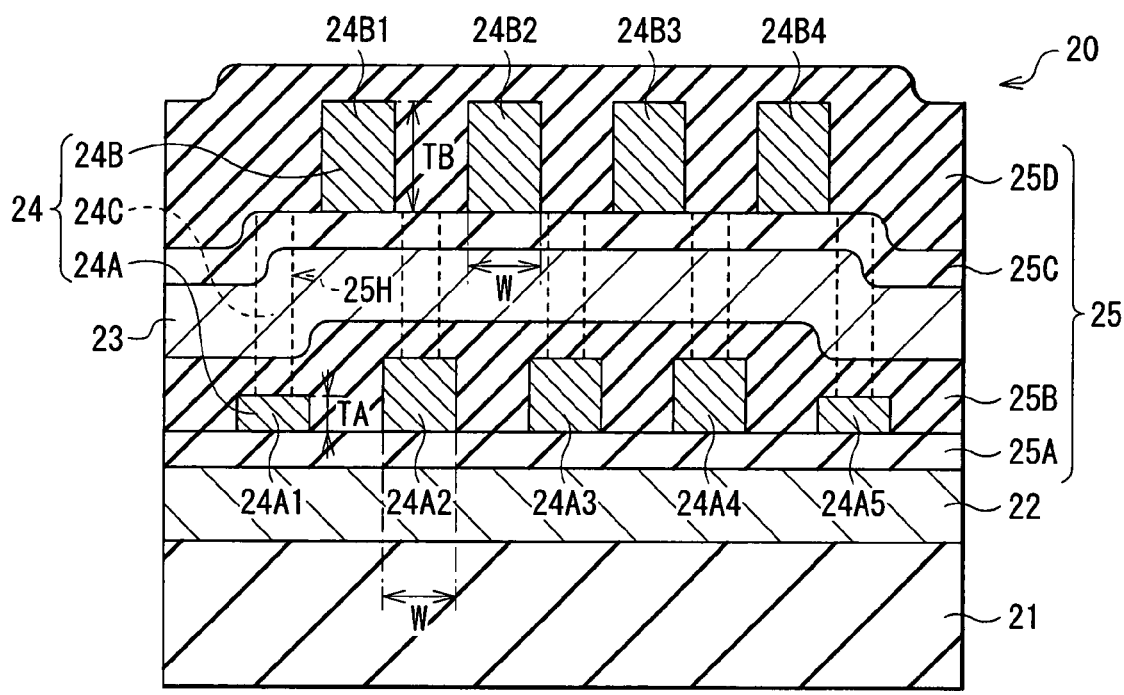
FIG. 15 is a section view showing another modification on a configuration of the thin film inductor of an embodiment of the invention.
Figure 16:
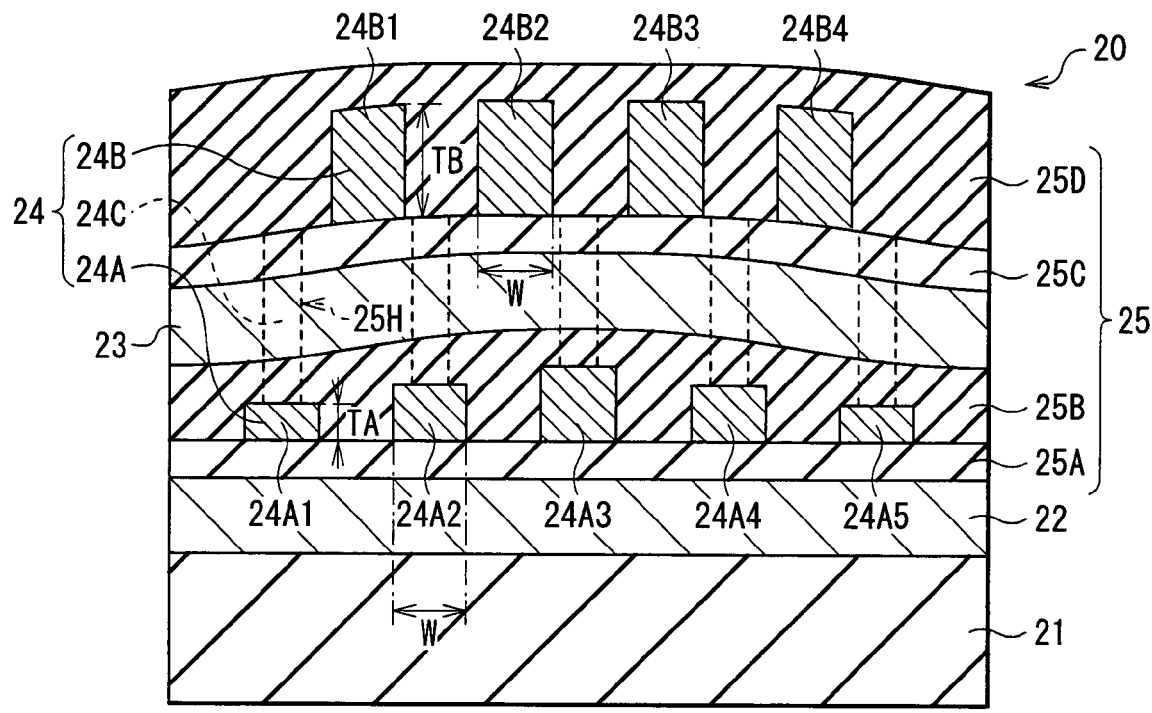
FIG. 16 is a section view showing still another modification on a configuration of the thin film inductor of an embodiment of the invention.

Specifically, for example, as shown in FIGS. 15 and 16 corresponding to FIG. 9, thickness TA of the lower coil portions 24A2 to 24A4 in portions other than the ends may be larger than thickness TA of the lower coil portions 24A1 and 24A5 in the ends. In this case, the lower coil portions 24A2 to 24A4 may be equal in thickness TA to one another (refer to FIG. 15), or the lower coil portions 24A1 to 24A5 may be gradually increased in thickness TA from the ends (24A1 and 24A5) to the center (24A3) (refer to FIG. 16). In these cases, the thickness TA of the lower coil portions 24A2 to 24A4 can be optionally set. In the cases, the same advantage as in the case shown in FIG. 9 can be obtained. Particularly, in the cases, since section areas of the lower coil portions 24A2 to 24A4 are increased compared with the case shown in FIG. 9, DC resistance of the lower coil portion 24A can be decreased. In addition, since the degree of concentration of a magnetic flux is increased closer to the lower coil portions 24A1 and 24A5 in the ends, in which the magnetic flux tends to be concentrated, inductance can be more increased.

In the cases shown in FIG. 15 and FIG. 16, when a case that maximum thickness TA of the lower coil portions 24A2 to 24A4 (thickness TA of the lower coil portions 24A2 to 24A4 in FIG. 15, and thickness TA of the lower coil portion 24A3 in FIG. 16) is equally set in the figures is considered, inductance can be increased in FIG. 16 compared with FIG. 15. The reason for this is as follows. In FIG. 15, difference in thickness TA is large between the lower coil portions 24A1 and 24A2, and between the lower coil portions 24A4 and 24A5, therefore steps are locally formed in the upper magnetic film 23, and thereby flatness becomes bad. On the other hand, in FIG. 16, since difference in thickness TA is small between adjacent lower coil portions in the lower coil portions 24A1 to 24A5, no steps are locally formed in the upper magnetic film 23, consequently flatness becomes good.

Figure 17:
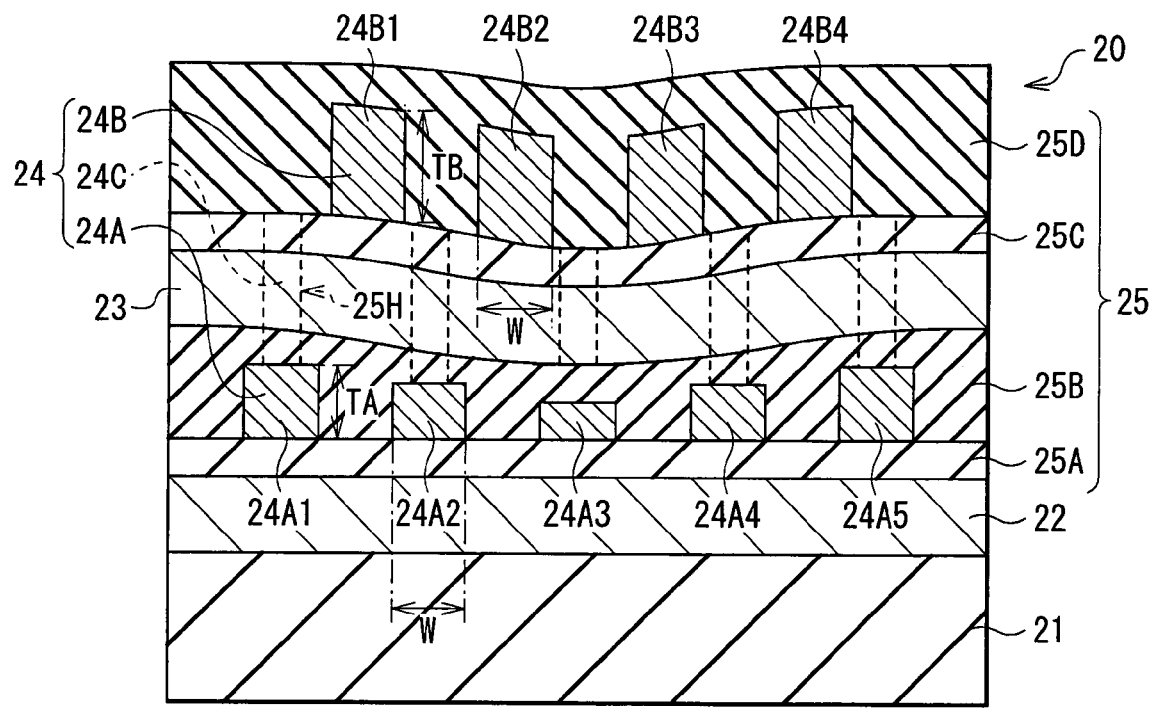
FIG. 17 is a section view showing still another modification on a configuration of the thin film inductor of an embodiment of the invention.

Moreover, for example, as shown in FIG. 17 corresponding to FIG. 9, thickness TA of the lower coil portions 24A1 and 24A5 in the ends may be larger than thickness TA of the lower coil portions 24A2 to 24A4 in portions other than the ends. For example, FIG. 17 shows a case that thickness TA of the lower coil portions 24A1 to 24A5 is gradually increased from the center (24A3) to the ends (24A1 and 24A5). In this case, the thickness TA of the lower coil portions 24A1, 24A2, 24A4 and 24A5 can be optionally set. In the case, the same advantage as in the case shown in FIG. 9 can be obtained. Particularly, in the cases, since section areas of the lower coil portions 24A1, 24A2, 24A4 and 24A5 are increased compared with the case shown in FIG. 9, DC resistance of the lower coil portions 24A can be decreased. In addition, when a magnetic flux tends to be concentrated closer to the lower coil portions 24A1 and 24A5 in the ends, the degree of concentration of the magnetic flux as a whole is averaged, therefore a DC superposition characteristic can be improved. While not shown here, when thickness TA of the lower coil portions 24A1 and 24A5 in the ends is larger than thickness TA of the lower coil portions 24A2 to 24A4 in the portions other than the ends, the lower coil portions 24A2 to 24A4 may be equal in thickness TA to one another.

Figure 18:
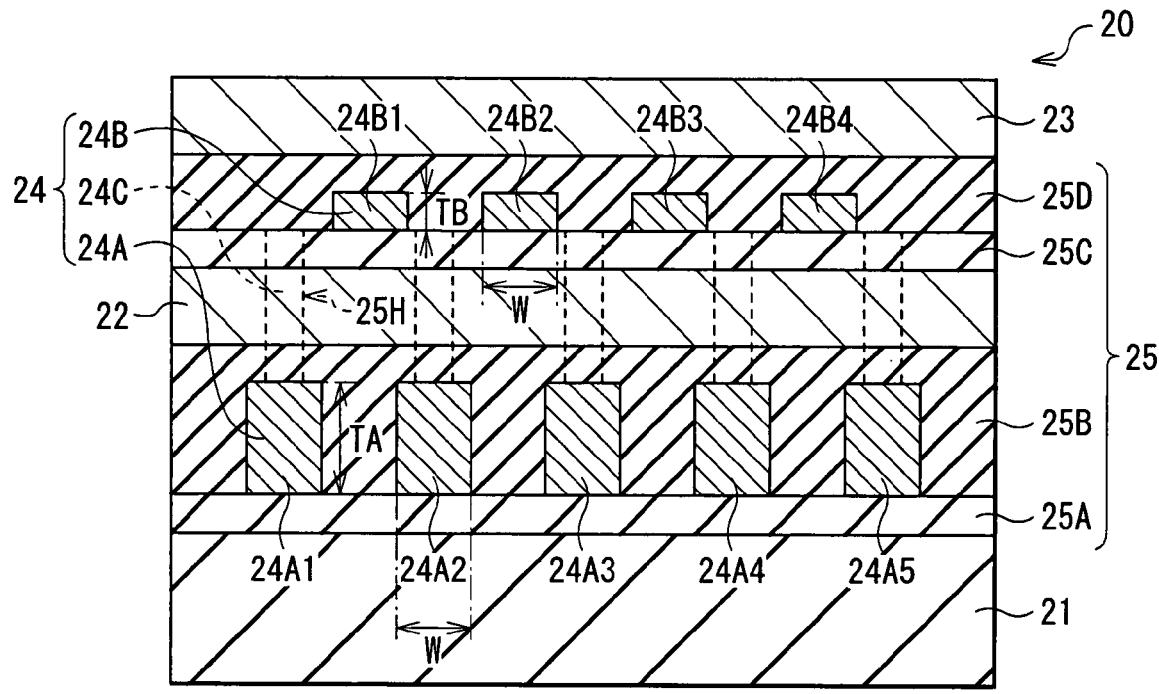
FIG. 18 is a section view showing still another modification on a configuration of the thin film inductor of an embodiment of the invention.

Moreover, in the embodiment, as the lower magnetic film 22 and the upper magnetic film 23 are disposed so as to sandwich the lower coil portions 24A, the thickness TA of the lower coil portions 24A is smaller than the thickness TB of the upper coil portions 24B, as shown in FIG. 9. However, this is not restrictive. For example, as shown in FIG. 18 corresponding to FIG. 9, the lower magnetic film 22 is disposed in place of the upper magnetic film 23, and the upper magnetic film 23 is disposed on the upper coil insulating film 25D, thereby when the lower magnetic film 22 and the upper magnetic film 23 are disposed so as to sandwich the upper coil portions 24B in place of the lower coil portions 24A, the thickness TB of the upper coil portions 24B may be smaller than the thickness TA of the lower coil portions 24A. In this case, the same operation as in the case shown in FIG. 9 can be obtained. Therefore, inductance can be improved.

Moreover, while a configuration of the thin film coil 24 is shown in FIGS. 8 to 11 in the embodiment, a relative positional relationship between the lower coil portions 24A and the upper coil portions 24B (overlapped areas), a leading direction of a terminal 24T1 or a terminal 24T2 or the like is not necessarily limited to that in the case as shown in FIGS. 8 to 11, and may be optionally set.

Moreover, in the embodiment, the lower magnetic film 22 and the upper magnetic film 23 have a uniform thickness respectively, as shown in FIG. 9. However, this is not restrictive, and thickness of each film may be changed. Specifically, for example, thickness of end portions corresponding to the lower coil portions 24A1 and 24A5 in the ends may be partially increased. In this case, since saturation magnetic flux density of each of the lower magnetic film 22 and the upper magnetic film 23 is improved in the end portions, the DC superposition characteristic can be improved.

EXAMPLE

Next, an example in connection with an embodiment of the invention is described.

First, the thin film inductor as shown in FIGS. 1 to 4 was manufactured to investigate performance of the thin film inductor of an embodiment of the invention. In this case, materials for forming the substrate, magnetic film, thin film coil and insulating film were silicon, cobalt-based amorphous alloy, cupper, and silicon oxide respectively, and thickness TA of the lower coil portions and thickness TB of the upper coil portions are 40 μm and 160 μm respectively (the total sum of the thickness TA and the thickness TB was 200 μm).

In addition, the thin film inductor of the comparative example as shown in FIG. 5 was also manufactured to comparatively evaluate the performance of the thin film inductor of an embodiment of the invention. In this case, the same manufacturing condition as that of the thin film inductor of an embodiment of the invention was used except that both of the thickness TA and the thickness TB were 100 μm.

As a result of investigation of performance of the thin film inductors of an embodiment of the invention and the comparative example, a result as shown in Table 1 was obtained. Table 1 depicts a correlation between a configuration of a thin film coil and performance of the thin film coil, showing the thickness TA (μm) of the lower coil portions, the thickness TB (μm) of the upper coil portion, permeability μ (−) of the magnetic film, and inductance L (μH).

TABLE 1

|  | Thickness TA (μm) | Thickness TB (μm) | permeability μ (—) | inductance L (μH) |
| --- | --- | --- | --- | --- |
| Example | 40 | 160 | 2000 | 0.455 |
| Comparative example | 100 | 100 | 1000 | 0.422 |

As known from the result shown in Table 1, the performance of the thin film inductor was improved in an embodiment of the invention compared with the comparative example. Specifically, in the comparative example where the thickness TA and the thickness TB are equal to each other, since permeability μ was small, only 1000, inductance L was 0.422 μH. On the contrary, in an embodiment of the invention where the thickness TA is smaller than the thickness TB, permeability μ was increased to 2000, which was twice the permeability in the comparative example, therefore inductance L was 0.455 μH, or improved by about 7.8% compared with the comparative example. From this, in the thin film inductor of an embodiment of the invention, it was confirmed that thickness of the lower coil portions was smaller than thickness of the upper coil portions in the case that the thin film coil of the solenoid type was provided, thereby inductance was able to be improved.

Figure 21:
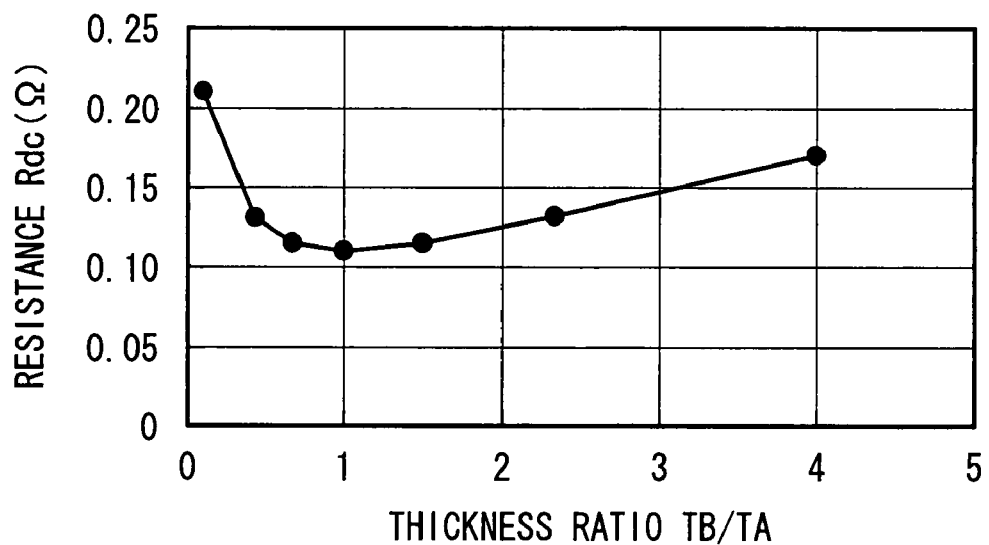
FIG. 21 is a view showing dependence on the thickness ratio TB/TA of resistance Rdc.
Figure 22:
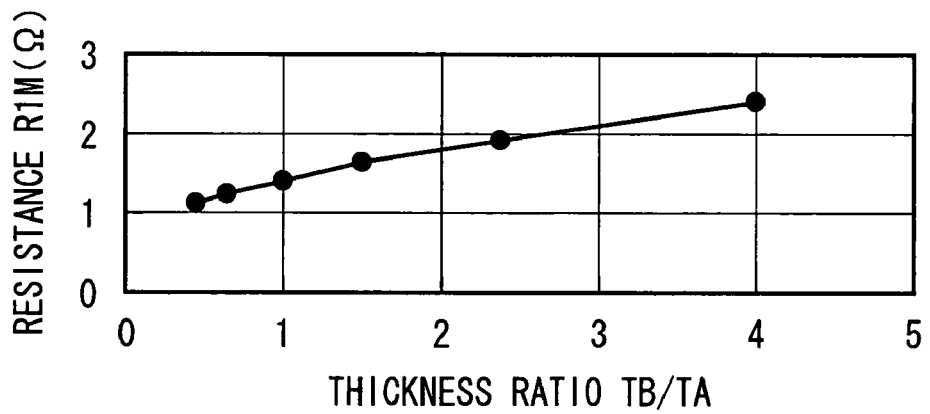
FIG. 22 is a view showing dependence on the thickness ratio TB/TA of resistance R1M.
Figure 23:
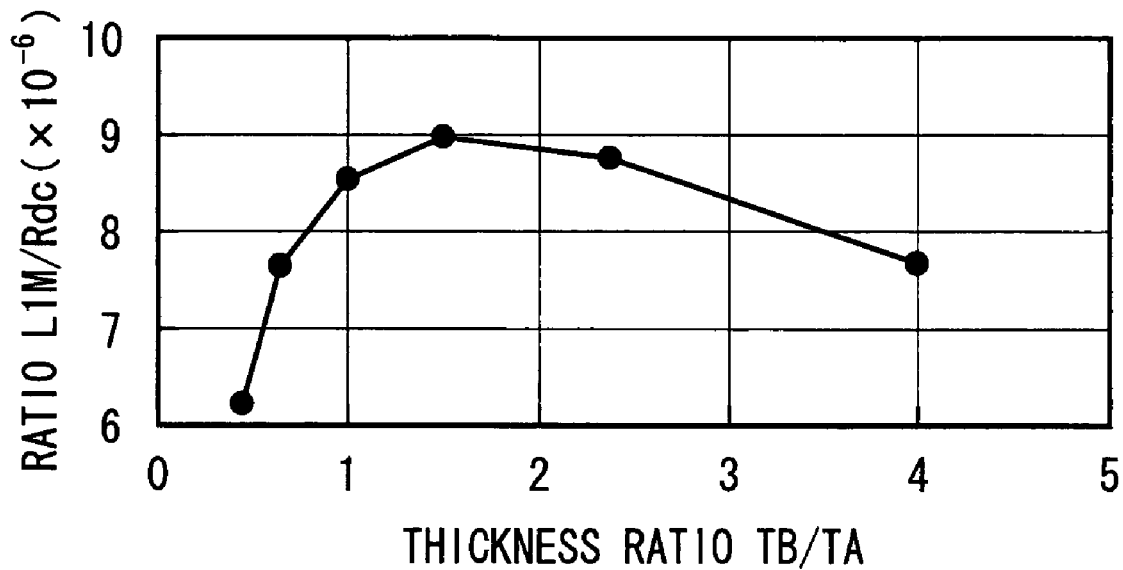
FIG. 23 is a view showing dependence on the thickness ratio TB/TA of a ratio L1M/Rdc of the inductance L1M to the resistance Rdc.
Figure 24:
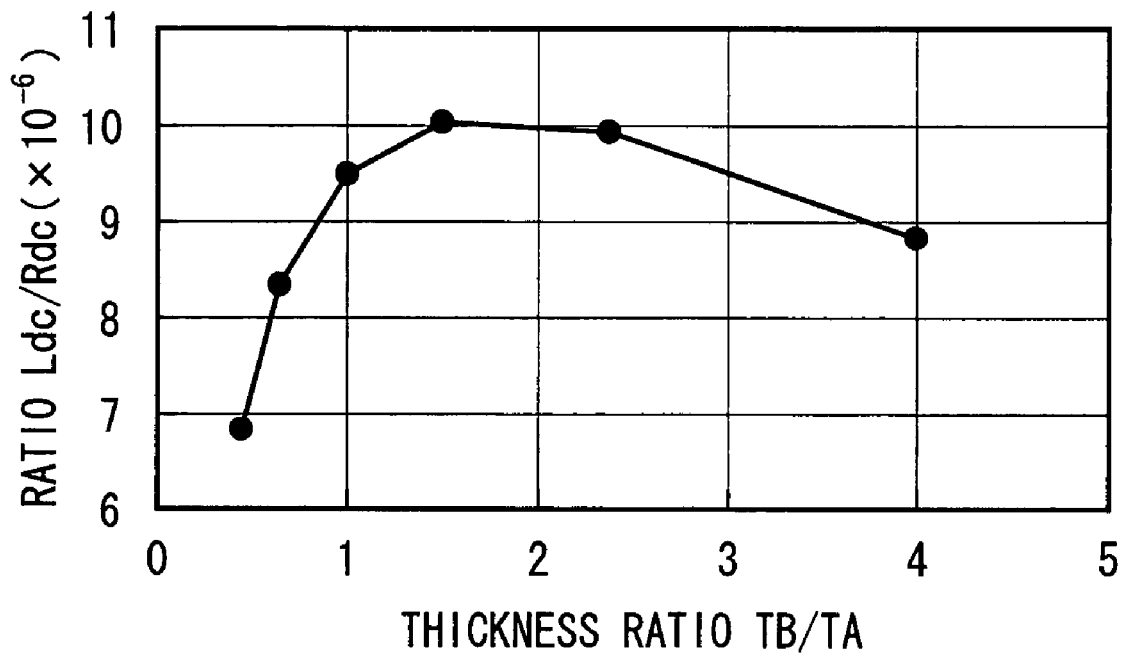
FIG. 24 is a view showing dependence on the thickness ratio TB/TA of a ratio Ldc/Rdc of the inductance Ldc to the resistance Rdc.

Next, various kinds of performance of the thin film inductors having the thin film coils of the solenoid type as shown in FIGS. 8 to 13 was estimated by field analysis using a finite element method. As a result, a series of results as shown in FIGS. 19 to 24 were obtained. FIGS. 19 to 22 show dependence on the thickness ratio TB/TA of inductance Ldc ($\times 10^{-6}$ H), inductance L1M ($\times 10^{-6}$ H), resistance Rdc (Ω) and resistance R1M (Ω) respectively. FIG. 23 and FIG. 24 show dependence on the thickness ratio TB/TA of a ratio of inductance L1M to resistance Rdc, L1M/Rdc, and dependence on the thickness ratio TB/TA of a ratio of the inductance Ldc to the resistance Rdc, Ldc/Rdc, respectively. Each value of the "inductance Ldc" and the "resistance Rdc" is a value calculated by magnetostatic analysis, and the value can be typically approximated by an analytical value in a low frequency region of a kHz order. On the other hand, each value of the "inductance L1M" and the "resistance R1M" is a value at a frequency of 1 MHz.

When the various kinds of performance of the thin film inductors were estimated, a series of parameters were set as follows. That is, for the thin film coils, it was set that line width was 100 μm, a line space was 20 μm, the number of turns was 16, a gap was 5 μm, and the total sum of the thickness TA of the lower coil portions and the thickness TB of the upper coil portions was 200 μm. In addition, the thickness ratio TB/TA was changed in seven levels of 0.1 (18 μm/182 μm), 0.43 (60 μm/140 μm), 0.67 (80 μm/120 μm), 1 (100 μm/100 μm), 1.5 (120 μm/80 μm), 2.33 (140 μm/60 μm), and 4 (160 μm/40 μm). The thickness ratio TB/TA<1 (TB/TA is 0.1, 0.43 or 0.67) corresponds to the second comparative example shown in FIG. 13, a case of the thickness ratio TB/TA=1 is corresponding to the first comparative example shown in FIG. 12, and a case of the thickness ratio TB/TA>1 (TB/TA is 1.5, 2.33 or 4) is corresponding to an embodiment of the invention shown in FIGS. 8 to 11, respectively. For the lower magnetic film and the upper magnetic film, it was set that thickness was 10 μm, permeability μ was 2000, and resistivity was 100 μΩcm. In FIGS. 19 to 24, the thickness ratio TB/TA is changed in 7 levels in FIG. 21 (including TB/TA=0.1), and the thickness ratio TB/TA is changed in 6 levels in figures other than FIG. 21 (not including TB/TA=0.1).

Figure 19:
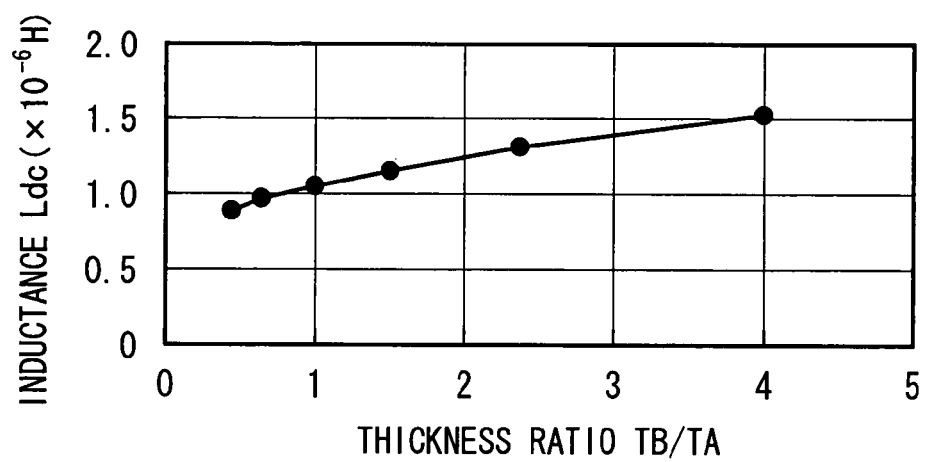
FIG. 19 is a view showing dependence on a thickness ratio TB/TA of inductance Ldc.
Figure 20:
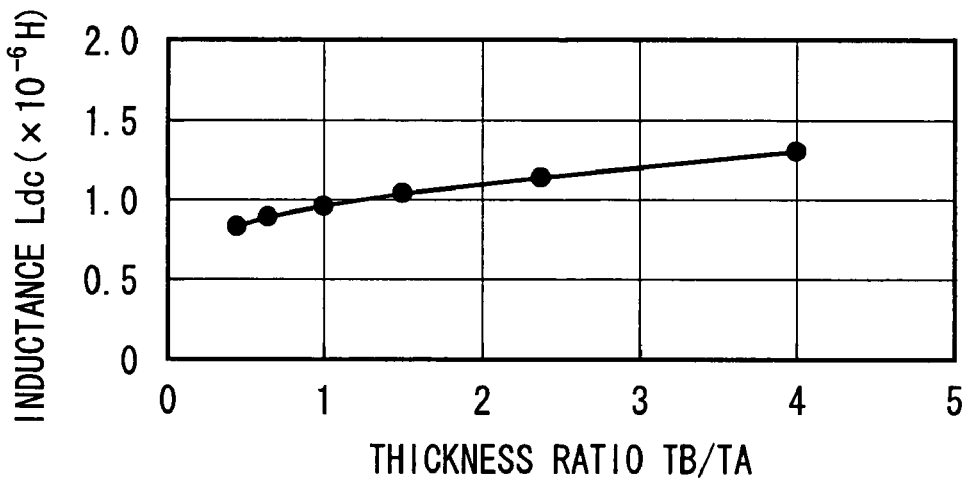
FIG. 20 is a view showing dependence on the thickness ratio TB/TA of inductance L1M.

As shown in FIG. 19 and FIG. 20, both of the inductance Ldc and the inductance L1M were gradually increased with increase in thickness ratio TB/TA. Moreover, as shown in FIG. 21 and FIG. 22, the resistance Rdc described a curve in a downward convex shape with the thickness ratio TB/TA=1 as the peak, and the resistance R1M was gradually increased with increase in thickness ratio TB/TA. From this, in the thin film inductance of an embodiment of the invention, it was confirmed that thickness TA of the lower coil portions was smaller than thickness TB of the upper coil portion in the case that the thin film coil of the solenoid type was provided, thereby inductance was able to be increased during operation.

From the results shown in FIGS. 19 to 21, as shown in FIG. 23 and FIG. 24, both the ratios L1M/Rdc and Ldc/Rdc described curves in an upward convex shape with the thickness ratio TB/TA=1.5 as a peak. In this case, ratios L1M/Rdc and Ldc/Rdc in a range of thickness ratio TB/TA>1, showing the thin film inductor of an embodiment of the invention, were larger than ratios L1M/Rdc and Ldc/Rdc in a range of thickness ratio TB/TA≦1, showing the first and second comparative examples, in a range of 1<TB/TA≦2.7. From this, in the thin film inductor of an embodiment of the invention, it was confirmed that the thickness ratio TB/TA was in a range of 1<TB/TA≦2.7, thereby sufficient inductance was able to be obtained while suppressing excessive increase in DC resistance of the thin film coil in both of a case that operation frequency was set at 1 MHz, and a case that it was set at a frequency lower than 1 MHz (for example, several kilohertz to several hundred kilohertz).

While the invention has been described with the embodiments and the examples hereinbefore, the invention is not limited to the modes described in the embodiments and the examples, and can be variously modified or altered. Specifically, for example, while a case that the thin film device of an embodiment of the invention was applied to a thin film inductor was described in the embodiments and the examples, this is not necessarily restrictive, and the thin film device may be applied to different devices other than the thin film inductor. As the "different devices", for example, a thin film transformer, a thin film magnetic sensor, or MEMS (Micro Electro Mechanical System), and a filter or module including the thin film inductor, thin film transformer, thin film magnetic sensor or MEMS are given. In the case that the thin film device is applied to the different devices, the same advantages as in the embodiments and the examples can be obtained.

INDUSTRIAL APPLICABILITY

The thin film device of the invention can be applied to, for example, a thin film inductor, a thin film transformer, a thin film magnetic sensor, or MEMS, and a filter or module including them.

Obviously many modifications and variations of the present invention are possible in the light of the above teachings. It is therefore to be understood that within the scope of the appended claims the invention may be practiced otherwise than as specifically described.

What is claimed is:

1. A thin film device comprising:
   a first magnetic film and a second magnetic film disposed oppositely to each other, and
   a thin film coil wound on the second magnetic film,
   wherein the thin film coil includes a plurality of first coil portions arranged between the first and the second magnetic films, a plurality of second coil portions arranged at a side opposite to a side of the first coil portions with the second magnetic film in between, and a plurality of third coil portions connecting the first and second coil portions so that the first, second and third coil portions are combined together in series to form the thin film coil,
   thickness of the first coil portions in at least ends in a winding direction of the thin film coil is smaller than thickness of the second coil portions, and
   the respective first coil portions in the ends have a thickness that is different from a thickness in portions other than the ends.

2. The thin film device according to claim 1:
   wherein thickness of the respective first coil portions is smaller than the thickness of the second coil portions.

3. The thin film device according to claim 2:
wherein the respective first coil portions are equal in thickness to one another.

4. The thin film device according to claim 2:
wherein the thickness of the respective first coil portions is large in portions other than the ends compared with the thickness in the ends.

5. The thin film device according to claim 4:
wherein the thickness of the respective first coil portions is gradually increased from the ends to the center.

6. The thin film device according to claim 1:
wherein one end or the other end in the longitudinal direction of the second coil portion is located so as to overlap with one end or the other end in the longitudinal direction of the first coil portion, and
the third coil portion is arranged in a position where the second coil portion overlaps with the first coil portion.

7. The thin film device according to claim 1:
wherein a ratio of a thickness TB of the second coil portions to a thickness TA of the first coil portions in at least the ends in the winding direction of the thin film coil, namely TB/TA, is in a range of: $1<TB/TA\leqq2.7$.

8. The thin film device according to claim 1:
wherein the thickness of the respective first coil portions is smaller in portions other than the ends compared with the thickness of the respective first coil portions in the ends.

* * * * *